United States Patent
Sawada et al.

(10) Patent No.: US 12,227,678 B2
(45) Date of Patent: Feb. 18, 2025

(54) LAMINATE PEELING METHOD, LAMINATE, AND LAMINATE PRODUCTION METHOD

(71) Applicant: NISSAN CHEMICAL CORPORATION, Tokyo (JP)

(72) Inventors: Kazuhiro Sawada, Toyama (JP); Shunsuke Moriya, Toyama (JP); Tetsuya Shinjo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 621 days.

(21) Appl. No.: 17/294,129

(22) PCT Filed: Nov. 14, 2019

(86) PCT No.: PCT/JP2019/044641
§ 371 (c)(1),
(2) Date: May 14, 2021

(87) PCT Pub. No.: WO2020/100965
PCT Pub. Date: May 22, 2020

(65) Prior Publication Data
US 2022/0002591 A1    Jan. 6, 2022

(30) Foreign Application Priority Data
Nov. 16, 2018    (JP) .................... 2018-215862

(51) Int. Cl.
*C09J 5/04* (2006.01)
*B32B 7/12* (2006.01)
(Continued)

(52) U.S. Cl.
CPC .................. *C09J 5/04* (2013.01); *B32B 7/12* (2013.01); *B32B 37/12* (2013.01); *B32B 43/006* (2013.01);
(Continued)

(58) Field of Classification Search
CPC ..... C09J 5/04; C09J 5/06; C09J 125/06; C09J 169/00; C09J 183/04; C09J 2425/00;
(Continued)

(56) References Cited

U.S. PATENT DOCUMENTS 10,468,286 B2 * 11/2019 Burggraf ................. H01L 24/94
11,926,765 B2 *  3/2024 Okuno ..................... C08L 83/04
(Continued)

FOREIGN PATENT DOCUMENTS

DE    102015118742 A1 *  5/2017 ........... H01L 21/185
EP     3 037 495 A1     6/2016
(Continued)

OTHER PUBLICATIONS

Extended European Search Report issued in EP Patent Application No. 19884657.8, dated Jun. 28, 2022.
(Continued)

*Primary Examiner* — Alex B Efta
*Assistant Examiner* — Alexander S Wright
(74) *Attorney, Agent, or Firm* — GREENBLUM & BERNSTEIN, P.L.C.

(57) ABSTRACT

A laminate debonding method includes producing a laminate by joining a first substrate formed of a semiconductor-forming substrate to a second substrate formed of a support substrate which allows passage of infrared laser light, by the mediation of a first adhesive layer provided on the first substrate and a second adhesive layer provided on the second substrate, wherein the first adhesive layer is obtained by curing an adhesive (A) containing a component which is cured through hydrosilylation, and the second adhesive layer is obtained by use of an adhesive (B) formed of a polymer adhesive having an aromatic ring in at least one of a main chain and a side chain and which allows passage of infrared laser light; and irradiating the laminate with infrared laser
(Continued)

light from a second substrate side for debonding the second substrate at the interface between the first and second adhesive layers.

4 Claims, 2 Drawing Sheets

(51) Int. Cl.
*B32B 37/12* (2006.01)
*B32B 43/00* (2006.01)
*C09J 125/06* (2006.01)
*C09J 169/00* (2006.01)
*C09J 183/04* (2006.01)
*H01L 21/683* (2006.01)

(52) U.S. Cl.
CPC ........... *C09J 125/06* (2013.01); *C09J 169/00* (2013.01); *C09J 183/04* (2013.01); *H01L 21/6836* (2013.01); *B32B 2457/14* (2013.01); *C09J 2425/00* (2013.01); *C09J 2469/00* (2013.01); *C09J 2483/00* (2013.01); *H01L 2221/68386* (2013.01)

(58) Field of Classification Search
CPC ...... C09J 2469/00; C09J 2483/00; C09J 5/00; C09J 2203/326; C09J 2301/416; C09J 2301/502; B32B 7/12; B32B 7/06; B32B 37/12; B32B 43/006; B32B 2457/14; B32B 9/04; B32B 17/06; B32B 2250/02; B32B 2255/26; B32B 2307/732; B32B 2307/748; H01L 21/6836; H01L 21/6835; H01L 2221/68386; H01L 2221/68318; H01L 2221/68381; H01L 2221/68327; C08G 77/12; C08G 77/20; C08L 2205/025

See application file for complete search history.

(56) References Cited

U.S. PATENT DOCUMENTS

| | | |
|---|---|---|
| 2006/0166464 A1 | 7/2006 | Jakob et al. |
| 2010/0043608 A1 | 2/2010 | Jakob |
| 2011/0272092 A1 | 11/2011 | Richter |
| 2012/0028438 A1 | 2/2012 | Richter |
| 2014/0342530 A1* | 11/2014 | Yasuda ............... H01L 21/6835 428/355 R |
| 2017/0200628 A1 | 7/2017 | Kamibayashi et al. |

FOREIGN PATENT DOCUMENTS

| | | | | |
|---|---|---|---|---|
| JP | H06-329917 | | 11/1994 | |
| JP | 2006-508540 | | 3/2006 | |
| JP | 2009-528688 | | 8/2009 | |
| JP | 2012-510715 | | 5/2012 | |
| JP | 2012-513684 | | 6/2012 | |
| JP | 2013-179135 | | 9/2013 | |
| JP | 2013-232459 | | 11/2013 | |
| JP | 2015-191940 | | 11/2015 | |
| JP | 2015191940 A | * | 11/2015 | ......... H01L 21/6835 |
| JP | 2016-86158 | | 5/2016 | |
| WO | 2015/190438 A1 | | 12/2015 | |

OTHER PUBLICATIONS

International Search Report issued in International Patent Application No. PCT/JP2019/044641, dated Dec. 17, 2019 with English translation.

* cited by examiner

LAMINATE PEELING METHOD, LAMINATE, AND LAMINATE PRODUCTION METHOD

TECHNICAL FIELD

The present invention relates to a method for debonding (peeling) a laminate in which a semiconductor wafer or a functional member such as a wiring substrate for mounting parts is temporarily bonded to a support (hereinafter may be referred to as a "laminate debonding method"), to such a laminate, and to a method for producing the laminate (hereinafter may be referred to as a "laminate production method").

BACKGROUND ART

Conventionally, electronic elements and wires are 2-dimensionally (within a plane) integrated on a semiconductor wafer. In a trend toward further integration, demand has arisen for a semiconductor integration technique which achieves 3-dimensional integration (i.e., stacking) in addition to 2-dimensional integration. In the technique of 3-dimensional integration, a number of layers are stacked by the mediation of through silicon vias (TSVs). In integration of multiple layers, each component wafer to be stacked is thinned by polishing a surface opposite the circuit-furnished surface (i.e., a back surface), and the thus-thinned semiconductor wafers are stacked.

Before thinning, the semiconductor wafer (may also be called simply "wafer") is fixed to a support for facilitating polishing by means of a polishing machine. Since the fixation must be removed after polishing, the fixation is called temporary bonding.

When the temporary bonding is removed by excessive force, in some cases a thinned semiconductor wafer may be broken or deformed. In order to prevent such a phenomenon, the temporarily bonded support must be detached in a gentle manner. However, from another aspect, it is not preferred that the temporarily bonded support be removed or slid by a stress applied during polishing of the back surface of the semiconductor wafer. Therefore, temporary bonding must withstand the stress during polishing and must be easily removed after polishing.

For example, one required performance includes having high stress (i.e., strong adhesion) within the plane during polishing and low stress (i.e., weak adhesion) toward the thickness direction during detaching.

Under such circumstances, temporary bonding must be performed with high stress (i.e., strong adhesion) within the plane during polishing and low stress (i.e., weak adhesion) toward the thickness direction during detaching. There have been reported several methods in relation to temporary bonding, including a method including forming a release layer through plasma polymerization of dimethylsiloxane and mechanically removing the release layer from an adhesive layer after polishing (see, for example, Patent Documents 1 and 2), and a method including fixing a semiconductor wafer to a support substrate by use of an adhesive composition, polishing the back surface of the semiconductor wafer, and removing the adhesive with an etchant (see, for example, Patent Document 3). As an embodiment of fixing a semiconductor wafer to a support by the mediation of an adhesive layer or the like, there has been reported a wafer processed body having a polymer layer formed by polymerizing an alkenyl group-containing organopolysiloxane and a hydrosilyl group-containing organopolysiloxane in the presence of a platinum catalyst in combination with a polymer layer formed of a thermosetting polysiloxane (see, for example, Patent Documents 4 to 6). Further, a composition containing a long chain α-acetylene alcohol and a curable silicone is reported as a hydrosilylation inhibitor (see, for example, Patent Document 7). However, recently, under rapid development in the semiconductor field, there is continuously strong demand for renewal and improvement of techniques, particularly those in relation to temporary bonding.

In addition to thinning wafers, the aforementioned temporary bonding is employed in, for example, a mounting process of mounting functional members (e.g., semiconductor elements) onto a functional substrate (e.g., a wiring substrate). In one specific mode, a temporarily bonded support is used for supporting the functional substrate in the first step, and parts are mounted. Then, the support is removed after molding.

PRIOR ART DOCUMENTS

Patent Documents

Patent Document 1: Japanese Patent Application (kohyo) Publication No. 2012-510715
Patent Document 2: Japanese Patent Application (kohyo) Publication No. 2012-513684
Patent Document 3: Japanese Patent Application Laid-Open (kokai) No. 2013-179135
Patent Document 4: Japanese Patent Application Laid-Open (kokai) No. 2013-232459
Patent Document 5: Japanese Patent Application Laid-Open (kokai) No. 2006-508540
Patent Document 6: Japanese Patent Application Laid-Open (kokai) No. 2009-528688
Patent Document 7: Japanese Patent Application Laid-Open (kokai) No. 1994-329917

SUMMARY OF THE INVENTION

Problems to be Solved by the Invention

Thus, an object of the present invention is to provide a method for debonding a laminate, which has excellent heat resistance during joining to a support (i.e., curing), processing of the back surface of a wafer, and a part-mounting process, the method involving temporary bonding so that the support can be easily removed. Another object is to provide such a laminate and a laminate production method.

Means for Solving the Problems

In a first mode of the present invention, there is provided a laminate debonding method, the method comprising a first step of producing a laminate by joining a first substrate formed of a semiconductor-forming substrate (i.e., a substrate on which a semiconductor element to be provided) to a second substrate formed of a support substrate which allows passage of infrared laser light, by the mediation of a first adhesive layer provided on the first substrate and a second adhesive layer provided on the second substrate, wherein the first adhesive layer is an adhesive layer obtained by curing an adhesive (A) containing a component which is cured through hydrosilylation, and the second adhesive layer is an adhesive layer which is obtained by use of an adhesive (B) formed of a polymer adhesive having an aromatic ring in at least one of a main chain and a side chain and which allows passage of infrared laser light; and a second step of irradiating the laminate with infrared laser light from a second substrate side for debonding the second substrate at the interface between the first and second adhesive layers.

A second mode is directed to a specific embodiment of the laminate debonding method as described in the first mode, wherein
the adhesive (A) comprises a polysiloxane (A1) having one or more units selected from the group consisting of a siloxane unit represented by $SiO_2$ (unit Q), a siloxane unit represented by $R^1R^2R^3SiO_{1/2}$ (unit M), a siloxane unit represented by $R^4R^5SiO_{2/2}$ (unit D), and a siloxane unit represented by $R^6SiO_{3/2}$ (unit T) (wherein each of $R^1$ to $R^6$ is a group or an atom bonded to a silicon atom and represents an alkyl group, an alkenyl group, or a hydrogen atom) and a platinum group metal catalyst (A2); and
the polysiloxane (A1) comprises
a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T' (wherein each of $R^{1'}$ to $R^{6'}$ is a group bonded to a silicon atom and represents an alkyl group or an alkenyl group, and at least one of $R^{1'}$ to $R^{6'}$ is an alkenyl group), and
a polyorganosiloxane (a2) having one or more units selected from the group consisting of a siloxane unit represented by $SiO_2$ (unit Q"), a siloxane unit represented by $R^{1''}R^{2''}R^{3''}SiO_{1/2}$ (unit M"), a siloxane unit represented by $R^{4''}R^{5''}SiO_{2/2}$ (unit D"), and a siloxane unit represented by $R^{6''}SiO_{3/2}$ (unit T"), and at least one unit selected from the group consisting of unit M", unit D", and unit T" (wherein each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom).

A third mode is directed to a specific embodiment of the laminate debonding method as described in the first or second mode, wherein the infrared laser light has a wavelength of 1 to 20 μm.

A fourth mode is directed to a specific embodiment of the laminate debonding method as described in the third mode, wherein the wavelength is 9.2 to 10.8 μm.

A fifth mode provides a laminate comprising a first substrate formed of a semiconductor-forming substrate, and a second substrate formed of a support substrate which allows passage of infrared laser light, the first substrate being joined to the second substrate by the mediation of a first adhesive layer provided on the first substrate and a second adhesive layer provided on the second substrate, wherein the first adhesive layer is an adhesive layer obtained by curing an adhesive (A) containing a component which is cured through hydrosilylation, and the second adhesive layer is an adhesive layer which is obtained by use of an adhesive (B) formed of a polymer adhesive having an aromatic ring in at least one of a main chain and a side chain and which allows passage of infrared laser light.

A sixth mode is directed to a specific embodiment of the laminate as described in the fifth mode, wherein the adhesive (A) comprises a polysiloxane (A1) having one or more units selected from the group consisting of a siloxane unit represented by $SiO_2$ (unit Q), a siloxane unit represented by $R^1R^2R^3SiO_{1/2}$ (unit M), a siloxane unit represented by $R^4R^5SiO_{2/2}$ (unit D), and a siloxane unit represented by $R^6SiO_{3/2}$ (unit T) (wherein each of $R^1$ to $R^6$ is a group or an atom bonded to a silicon atom and represents an alkyl group, an alkenyl group, or a hydrogen atom) and a platinum group metal catalyst (A2); and
the polysiloxane (A1) comprises
a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T' (wherein each of $R^{1'}$ to $R^{6'}$ is a group bonded to a silicon atom and represents an alkyl group or an alkenyl group, and at least one of $R^{1'}$ to $R^{6'}$ is an alkenyl group), and
a polyorganosiloxane (a2) having one or more units selected from the group consisting of a siloxane unit represented by $SiO_2$ (unit Q"), a siloxane unit represented by $R^{1''}R^{2''}R^{3''}SiO_{1/2}$ (unit M"), a siloxane unit represented by $R^{4''}R^{5''}SiO_{2/2}$ (unit D"), and a siloxane unit represented by $R^{6''}SiO_{3/2}$ (unit T"), and at least one unit selected from the group consisting of unit M", unit D", and unit T" (wherein each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom).

A seventh mode provides a method for producing a laminate as recited in the fifth or sixth mode, the method comprising
a first step of applying the adhesive (A) onto a surface of the first substrate, to thereby form a first adhesive coating layer;
a second step of applying the adhesive (B) onto a surface of the second substrate, to thereby form a second adhesive coating layer; and
a third step of applying a load to the first substrate and the second substrate in a thickness direction, to thereby closely adhere the first layer to the second layer, while the first adhesive coating layer of the first substrate and the second adhesive coating layer of the second substrate are subjected to at least one of a heat treatment and a reduced pressure treatment, and then performing a post-heat treatment, to thereby form the laminate.

According to the laminate debonding method of the present invention, a laminate is produced by the mediation of a first adhesive layer obtained by curing an adhesive (A) containing a component which is cured through hydrosilylation, and a second adhesive layer which is obtained by use of an adhesive (B) formed of a polymer adhesive having an aromatic ring in at least one of a main chain and a side chain and which allows passage of infrared laser light, and by irradiating the laminate with infrared laser light from a second substrate side for debonding the second substrate at the interface between the first and second adhesive layers, to thereby induce debonding at the interface. Thus, debonding can be effectively performed in an easy manner.

Also, according to the debonding method, debonding can be easily achieved by irradiation with infrared laser light generally employed in laser processing. Thus, debonding can be performed by means of an apparatus customary employed in laser processing, without use of a particularly arranged apparatus.

In the laminate of the present invention, the first substrate and the second substrate are stacked by the mediation of a first adhesive layer obtained by curing an adhesive (A)

containing a component which is cured through hydrosilylation, and a second adhesive layer which is obtained by use of an adhesive (B) formed of a polymer adhesive having an aromatic ring in at least one of a main chain and a side chain and which allows passage of infrared laser light. Thus, in irradiation of the laminate with infrared laser light from a second substrate side, the infrared laser light passing through the second adhesive layer is absorbed by the first adhesive layer. As a result, adhesion at the interface between the first and second adhesive layers decreases, thereby facilitating debonding.

MODES FOR CARRYING OUT THE INVENTION

The laminate debonding method of the present invention sequentially includes producing a laminate having a first substrate formed of a semiconductor-forming substrate and a second substrate formed of a support substrate, processing the laminate, and removing the second substrate and the second adhesive layer from the first substrate and the first adhesive layer.

The first substrate formed of a semiconductor-forming substrate is, for example, a wafer. Specific examples of the wafer include, but are not limited to, a glass wafer and a silicon wafer, having a diameter of about 300 mm and a thickness of about 770 μm.

The second substrate formed of a support substrate serves as a support (carrier) joined for supporting the first substrate. No particular limitation is imposed on the second substrate, so long as passage of infrared laser light is secured. The transmittance of the layer is generally 80%, preferably 90%. Specific examples of the layer include, but are not limited to, a silicon wafer having a diameter of about 300 mm and a thickness of about 700 μm.

As used herein, the term "infrared laser light" refers to laser light employed in the below-mentioned debonding step. An example of the laser light has a wavelength of 1 to 20 μm. More preferably, the wavelength of the infrared laser light is 9.2 to 10.8 μm.

The laminate of the present invention has a first substrate and a second substrate. These substrates are joined by the mediation of a first adhesive layer formed on the first substrate, and a second adhesive layer formed on the second substrate such that the second adhesive layer faces the first adhesive layer. The first adhesive layer is an adhesive layer formed by curing an adhesive (A). The second adhesive layer is an adhesive layer which is formed by use of an adhesive (B) and which allows passage of the aforementioned infrared laser light. No particular limitation is imposed on the adhesive layer which allows passage of infrared laser light, so long as passage of infrared laser light is secured. The transmittance of the layer is generally 80%, preferably 90%.

The adhesive (A) employed in the present invention contains a component which is cured through hydrosilylation and is used for forming the first adhesive layer provided so as to come into contact with the first substrate. The adhesive (A) can bind, in a peelable manner, the first substrate (e.g., wafer) to the second adhesive layer provided so as to come into contact with the second substrate (e.g., support). For example, the adhesive (A) realizes processing of the laminate.

The adhesive (B) is a polymer adhesive having an aromatic ring in at least one of a main chain and a side chain and which allows the adhesive layer produced therefrom to ensure passage of infrared laser light. The adhesive (B) is used for forming the second adhesive layer provided so as to come into contact with the second substrate. The adhesive (B) can bind, in a peelable manner, the second substrate (e.g., support) to the first adhesive layer provided so as to come into contact with the first substrate (e.g., wafer). For example, the adhesive (B) realizes processing of the laminate.

No particular limitation is imposed on the adhesive (B), so long as it satisfies the aforementioned conditions. Specific examples include, but are not limited to, a polycarbonate adhesive and a polystyrene adhesive. These adhesives serving as adhesive (B) may be used singly or in combination of two or more species.

In the laminate of the present invention, the first substrate and the second substrate are bonded together via temporary bonding by the mediation of the first adhesive layer and the second adhesive layer. In this state, a wafer can be thinned by, for example, polishing a surface opposite the circuit-furnished surface (i.e., a back surface).

Meanwhile, after completion of such processing or the like, when the laminate is irradiated with infrared laser light from a second substrate (e.g., support) side, the second substrate can be easily removed together with the second adhesive layer. The first adhesive layer remaining on the first substrate can be removed by use of, for example, a cleaning agent formed of organic solvent.

The first adhesive layer provides a relatively high adhesion, but the second adhesive layer exhibits an adhesion lower than that of the first adhesive layer.

Also, the first adhesive layer absorbs infrared laser light, but the second adhesive layer allows passage of infrared laser light. Thus, when the laminate is irradiated with infrared laser light from a second substrate side, the laser light passes through the second adhesive layer to the first adhesive layer and is absorbed by the first adhesive layer. Since the first adhesive layer is an adhesive having a predetermined composition, the layer is degraded through thermal decomposition or the like by absorbing the laser light. In particular, the bonding strength on the first adhesive layer side decreases.

As a result, debonding occurs at the interface between the second adhesive layer and the first adhesive layer, and the second substrate can be easily removed together with the second adhesive layer.

The laminate of the present invention has an adhesive layer which can be debonded off through irradiation with infrared laser light. Therefore, the adhesive layer can be debonded off without applying an excessive load to the support or the wafer, which is advantageous.

As used herein, the expression "can be debonded" or "peelable" refers to a state of lower bonding strength. In other words, it means excellent peelability for ensuring easy debonding. The bonding strength of the cured film obtained from the adhesive (A) employed in the present invention is reduced through irradiation with an infrared ray, as compared with that in the stage before irradiation.

The first adhesive layer of the laminate according to the present invention is formed by curing the adhesive (A). The adhesive (A) contains a component which is cured through hydrosilylation and may further contain other components.

In one preferred embodiment of the present invention, the adhesive (A) contains, as a component which is cured through hydrosilylation, a polysiloxane (A1) having one or more units selected from the group consisting of a siloxane unit represented by $SiO_2$ (unit Q), a siloxane unit represented by $R^1R^2R^3SiO_{2/2}$ (unit M), a siloxane unit represented by $R^4R^5SiO_{2/2}$ (unit D), and a siloxane unit represented by $R^6SiO_{3/2}$ (unit T), and a platinum group metal catalyst (A2); wherein the polysiloxane (A1) contains a polyorganosiloxane (a1) having one or more units selected from the group consisting of a siloxane unit represented by $SiO_2$ (unit Q'), a siloxane unit represented by $R^{1'}R^{2'}R^{3'}SiO_{2/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T', and a polyorganosiloxane (a2) having one or more units selected from the group consisting of a siloxane unit represented by $SiO_2$ (unit Q''), a siloxane unit represented by $R^{1''}R^{2''}R^{3''}SiO_{2/2}$ (unit M''), a siloxane unit represented by $R^{4''}R^{5''}SiO_{2/2}$ (unit D''), and a siloxane unit represented by $R^{6''}SiO_{3/2}$ (unit T''), and at least one unit selected from the group consisting of unit M'', unit D'', and unit T''.

Each of $R^1$ to $R^6$ is a group or an atom bonded to a silicon atom and represents an alkyl group, an alkenyl group, or a hydrogen atom.

Each of $R^{1'}$ to $R^{6'}$ is a group bonded to a silicon atom and represents an alkyl group or an alkenyl group, and at least one of $R^{1'}$ to $R^{6'}$ is an alkenyl group.

Each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom.

The alkyl group may be linear-chain, branched-chain, or cyclic. No particular limitation is imposed on the number of carbon atoms thereof, and the number of carbon atoms is preferably 40 or less, more preferably 30 or less, still more preferably 20 or less, yet more preferably 10 or less.

Specific examples of the linear-chain or branched chain alkyl group include, but are not limited to, methyl, ethyl, n-propyl, i-propyl, n-butyl, i-butyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl.

Of these, methyl is preferred.

Specific examples of the cyclic alkyl group include, but are not limited to, cycloalkyl groups such as cyclopropyl, cyclobutyl, 1-methyl-cyclopropyl, 2-methyl-cyclopropyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethylcyclopropyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-i-propyl-cyclopropyl, 2-i-propyl-cyclopropyl, 1,2,2-trimethyl-cyclopropyl, 1,2,3-trimethyl-cyclopropyl, 2,2,3-trimethyl-cyclopropyl, 1-ethyl-2-methyl-cyclopropyl, 2-ethyl-1-methyl-cyclopropyl, 2-ethyl-2-methyl-cyclopropyl, and 2-ethyl-3-methyl-cyclopropyl; and bicycloalkyl groups such as bicyclobutyl, bicyclopentyl, bicyclohexyl, bicycloheptyl, bicyclooctyl, bicyclononyl, and bicyclodecyl.

The alkenyl group may be linear-chain or branched-chain. No particular limitation is imposed on the number of carbon atoms thereof, and the number of carbon atoms is preferably 40 or less, more preferably 30 or less, still more preferably 20 or less.

Specific examples of the alkenyl group include, but are not limited to, ethenyl, 1-propenyl, 2-propenyl, 1-methyl-1-ethenyl, 1-butenyl, 2-butenyl, 3-butenyl, 2-methyl-1-propenyl, 2-methyl-2-propenyl, 1-ethylethenyl, 1-methyl-1-propenyl, 1-methyl-2-propenyl, 1-pentenyl, 2-pentenyl, 3-pentenyl, 4-pentenyl, 1-n-propylethenyl, 1-methyl-1-butenyl, 1-methyl-2-butenyl, 1-methyl-3-butenyl, 2-ethyl-2-propenyl, 2-methyl-1-butenyl, 2-methyl-2-butenyl, 2-methyl-3-butenyl, 3-methyl-1-butenyl, 3-methyl-2-butenyl, 3-methyl-3-butenyl, 1,1-dimethyl-2-propenyl, 1-i-propylethenyl, 1,2-dimethyl-1-propenyl, 1,2-dimethyl-2-propenyl, 1-cyclopentenyl, 2-cyclopentenyl, 3-cyclopentenyl, 1-hexenyl, 2-hexenyl, 3-hexenyl, 4-hexenyl, 5-hexenyl, 1-methyl-1-pentenyl, 1-methyl-2-pentenyl, 1-methyl-3-pentenyl, 1-methyl-4-pentenyl, 1-n-butylethenyl, 2-methyl-1-pentenyl, 2-methyl-2-pentenyl, 2-methyl-3-pentenyl, 2-methyl-4-pentenyl, 2-n-propyl-2-propenyl, 3-methyl-1-pentenyl, 3-methyl-2-pentenyl, 3-methyl-3-pentenyl, 3-methyl-4-pentenyl, 3-ethyl-3-butenyl, 4-methyl-1-pentenyl, 4-methyl-2-pentenyl, 4-methyl-3-pentenyl, 4-methyl-4-pentenyl, 1,1-dimethyl-2-butenyl, 1,1-dimethyl-3-butenyl, 1,2-dimethyl-1-butenyl, 1,2-dimethyl-2-butenyl, 1,2-dimethyl-3-butenyl, 1-methyl-2-ethyl-2-propenyl, 1-s-butylethenyl, 1,3-dimethyl-1-butenyl, 1,3-dimethyl-2-butenyl, 1,3-dimethyl-3-butenyl, 1-i-butylethenyl, 2,2-dimethyl-3-butenyl, 2,3-dimethyl-1-butenyl, 2,3-dimethyl-2-butenyl, 2,3-dimethyl-3-butenyl, 2-i-propyl-2-propenyl, 3,3-dimethyl-1-butenyl, 1-ethyl-1-butenyl, 1-ethyl-2-butenyl, 1-ethyl-3-butenyl, 1-n-propyl-1-propenyl, 1-n-propyl-2-propenyl, 2-ethyl-1-butenyl, 2-ethyl-2-butenyl, 2-ethyl-3-butenyl, 1,1,2-trimethyl-2-propenyl, 1-t-butylethenyl, 1-methyl-1-ethyl-2-propenyl, 1-ethyl-2-methyl-1-propenyl, 1-ethyl-2-methyl-2-propenyl, 1-i-propyl-1-propenyl, 1-i-propyl-2-propenyl, 1-methyl-2-cyclopentenyl, 1-methyl-3-cyclopentenyl, 2-methyl-1-cyclopentenyl, 2-methyl-2-cyclopentenyl, 2-methyl-3-cyclopentenyl, 2-methyl-4-cyclopentenyl, 2-methyl-5-cyclopentenyl, 2-methylene-cyclopentyl, 3-methyl-1-cyclopentenyl, 3-methyl-2-cyclopentenyl, 3-methyl-3-cyclopentenyl, 3-methyl-4-cyclopentenyl, 3-methyl-5-cyclopentenyl, 3-methylene-cyclopentyl, 1-cyclohexenyl, 2-cyclohexenyl, and 3-cyclohexenyl.

Of these, ethenyl and 2-propenyl are preferred.

As described above, the polysiloxane (A1) includes the polyorganosiloxane (a1) and the polyorganosiloxane (a2). In curing, the alkenyl group present in the polyorganosiloxane (a1) and the hydrogen atom (Si—H group) present in the polyorganosiloxane (a2) form a cross-linking structure through hydrosilylation in the presence of the platinum group metal catalyst (A2).

The polyorganosiloxane (a1) has one or more units selected from the group consisting of unit Q', unit M', unit D', and unit T', and at least one unit selected from the group consisting of unit M', unit D', and unit T'. Two or more polyorganosiloxanes satisfying the above conditions may be used in combination as the polyorganosiloxane (a1).

Examples of preferred combinations of two or more units selected from the group consisting of unit Q', unit M', unit D', and unit T' include, but are not limited to, (unit Q' and unit M'), (unit D' and unit M'), (unit T' and unit M'), and (unit Q', unit T', and unit M').

In the case where the polyorganosiloxane (a1) includes two or more polyorganosiloxanes, examples of preferred combinations include, but are not limited to, (unit Q' and unit M')+(unit D' and unit M'; (unit T' and unit M')+(unit D' and unit M'); and (unit Q', unit T', and unit M')+(unit T' and unit M').

The polyorganosiloxane (a2) has one or more units selected from the group consisting of unit Q", unit M", unit D", and unit T", and at least one unit selected from the group consisting of unit M", unit D", and unit T". Two or more polyorganosiloxanes satisfying the above conditions may be used in combination as the polyorganosiloxane (a2).

Examples of preferred combinations of two or more units selected from the group consisting of unit Q", unit M", unit D", and unit T" include, but are not limited to, (unit M" and unit D"), (unit Q" and unit M"), and (unit Q", unit T", and unit M").

The polyorganosiloxane (a1) is formed of siloxane units in which an alkyl group and/or an alkenyl group is bonded to a silicon atom. The alkenyl group content of the entire substituents $R^{1'}$ to $R^{6'}$ is preferably 0.1 mol % to 50.0 mol %, more preferably 0.5 mol % to 30.0 mol %, and the remaining $R^{1'}$ to $R^{6'}$ may be alkyl groups.

The polyorganosiloxane (a2) is formed of siloxane units in which an alkyl group and/or a hydrogen atom is bonded to a silicon atom. The hydrogen atom content of the entire substituents or atoms $R^{1''}$ to $R^{6''}$ is preferably 0.1 mol % to 50.0 mol %, more preferably 10.0 mol % to 40.0 mol %, and the remaining $R^{1''}$ to $R^{6''}$ may be alkyl groups.

The polysiloxane (A1) includes the polyorganosiloxane (a1) and the polyorganosiloxane (a2). In one preferred embodiment of the present invention, the ratio by mole of alkenyl groups present in the polyorganosiloxane (a1) to hydrogen atoms forming Si—H bonds present in the polyorganosiloxane (a2) is 1.0:0.5 to 1.0:0.66.

The weight average molecular weight of each of the polyorganosiloxane (a1) and the polyorganosiloxane (a2) are generally 500 to 1,000,000, preferably 5,000 to 50,000.

In the present invention, weight average molecular weight may be determined by means of, for example, a GPC apparatus (EcoSEC, HLC-8320GPC, products of Tosoh Corporation) and GPC columns (Shodex (registered trademark), KF-803L, KF-802, and KF-801, products of Showa Denko K.K.) at a column temperature of 40° C. and a flow rate of 1.0 mL/min by use of tetrahydrofuran as an eluent (extraction solvent) and polystyrene (product of Sigma-Aldrich) as a standard substance.

Notably, as mentioned below, the polyorganosiloxane (a1) and the polyorganosiloxane (a2) included in the adhesive (A) employed in the present invention react with each other via hydrosilylation, to thereby form a cured film. Thus, the curing mechanism differs from the mechanism of curing mediated by, for example, silanol groups. Therefore, neither of the siloxanes of the present invention is required to have a silanol group or a functional group forming a silanol group through hydrolysis (e.g., an alkyloxy group).

In one preferred embodiment of the present invention, the adhesive (A) contains the aforementioned polysiloxane (A1) and the platinum group metal catalyst (A2).

The platinum-based metallic catalyst is used to accelerate hydrosilylation between alkenyl groups of the polyorganosiloxane (a1) and Si—H groups of the polyorganosiloxane (a2).

Specific examples of the platinum-based metallic catalyst include, but are not limited to, platinum catalysts such as platinum black, platinum(II) chloride, chloroplatinic acid, a reaction product of chloroplatinic acid and a monohydric alcohol, a chloroplatinic acid-olefin complex, and platinum bis(acetoacetate).

Examples of the platinum-olefin complex include, but are not limited to, a complex of platinum with divinyltetramethyldisiloxane.

The amount of platinum group metal catalyst (A2) is generally 1.0 to 50.0 ppm, with respect to the total amount of polyorganosiloxane (a1) and polyorganosiloxane (a2).

In order to suppress the progress of hydrosilylation, the adhesive (A) may contain a polymerization inhibitor (A3).

No particular limitation is imposed on the polymerization inhibitor, so long as it can suppress the progress of hydrosilylation. Specific examples of the polymerization inhibitor include, but are not limited to, alkynylalkyl alcohols such as 1-ethynyl-1-cyclohexanol.

Generally, the amount of polymerization inhibitor with respect to the polyorganosiloxane (a1) and the polyorganosiloxane (a2) is 1000.0 ppm or more from the viewpoint of attaining the effect, and 10000.0 ppm or less from the viewpoint of preventing excessive suppression of hydrosilylation.

In addition to the aforementioned polysiloxane, the adhesive (A) of the present invention may further contain another polysiloxane (a3) for regulating adhesion and for other reasons.

Examples of the additional polysiloxane (a3) include, but are not limited to, an epoxy-modified polyorganosiloxane, a methyl-group-containing polyorganosiloxane, and a phenyl-group-containing polyorganosiloxane. These members of the polysiloxane (a3) may be contained in combination of two or more species.

Examples of the epoxy-modified polyorganosiloxane include a siloxane containing a siloxane unit represented by $R^{11}R^{12}SiO_{2/2}$ (unit $D^{10}$).

$R^{11}$ is a group bonded to a silicon atom and represents an alkyl group, and $R^{12}$ is a group bonded to a silicon atom and represents an epoxy group or an organic group containing an epoxy group. Specific examples of the alkyl group include those as exemplified above.

The epoxy group in the organic group containing an epoxy group may be an independent epoxy group which does not condense with another ring structure, or may be an epoxy group forming a condensed ring with another ring structure (e.g., a 1,2-epoxycyclohexyl group).

Specific example of the organic group containing an epoxy group include, but are not limited to, 3-glycidoxy-propyl and 2-(3,4-epoxycyclohexyl)ethyl.

In the present invention, examples of preferred epoxy-modified polyorganosiloxanes include, but are not limited to, epoxy-modified polydimethylsiloxane.

The epoxy-modified polyorganosiloxane used as the additional polysiloxane (a3) contains the aforementioned siloxane unit (unit $D^{10}$), but may also contain the aforementioned unit Q, unit M and/or unit T, in addition to unit $D^{1o}$.

In one preferred embodiment of the present invention, specific examples of the epoxy-modified polyorganosiloxane serving as the additional polysiloxane (a3) include polyorganosiloxane formed only of unit $D^{10}$, polyorganosiloxane formed of unit $D^{10}$ and unit Q, polyorganosiloxane formed of unit $D^{10}$ and unit M, polyorganosiloxane formed of unit $D^{10}$ and unit T, polyorganosiloxane formed of unit $D^{10}$, unit Q, and unit M, polyorganosiloxane formed of unit $D^{10}$, unit M, and unit T, and polyorganosiloxane formed of unit $D^{10}$, unit Q, unit M, and unit T.

The epoxy-modified polyorganosiloxane serving as the additional polysiloxane (a3) is preferably an epoxy-modified polyorganodimethylsiloxane having an epoxy value of 0.1 to 5. The weight average molecular weight thereof is generally 1,500 to 500,000, but preferably 100,000 or lower, for the purpose of suppression of deposition in the adhesive.

Specific examples of the epoxy-modified polyorganosiloxane include, but are not limited to, CMS-227 (product of Gelest Inc., weight average molecular weight: 27,000) represented by formula (A-1), ECMS-327 (product of Gelest Inc., weight average molecular weight: 28,800) represented by formula (A-2), KF-101 (product of Shin-Etsu Chemical Co., Ltd., weight average molecular weight: 31,800) represented by formula (A-3), KF-1001 (product of Shin-Etsu Chemical Co., Ltd., weight average molecular weight: 55,600) represented by formula (A-4), KF-1005 (product of Shin-Etsu Chemical Co., Ltd., weight average molecular weight: 11,500) represented by formula (A-5), X-22-343 (product of Shin-Etsu Chemical Co., Ltd., weight average molecular weight: 2,400) represented by formula (A-6), BY16-839 (product of Dow Corning, weight average molecular weight: 51,700) represented by formula (A-7), and ECMS-327 (product of Gelest Inc., weight average molecular weight: 28,800) represented by formula (A-8).

[F1]

(A-1)

(Each of m and n represents the number of repeating units.)

[F2]

(A-2)

(Each of m and n represents the number of repeating units.)

[F3]

(A-3)

(Each of m and n represents the number of repeating units. R represents a C1 to C10 alkylene group.)

[F4]

(A-4)

(Each of m and n represents the number of repeating units. R represents a C1 to C10 alkylene group.)

[F5]

(A-5)

(Each of m, n and o represents the number of repeating units. R represents a C1 to C10 alkylene group.)

[F6]

(A-6)

(Each of m and n represents the number of repeating units. R represents a C1 to C10 alkylene group.)

[F7]

(A-7)

(Each of m and n represents the number of repeating units. R represents a C1 to C10 alkylene group.)

[F8]

(A-8)

(Each of m and n represents the number of repeating units.)

Examples of the methyl-group-containing polyorganosiloxane include a siloxane containing a siloxane unit represented by $R^{210}R^{220}SiO_{2/2}$ (unit $D^{200}$). Preferably, the methyl-group-containing polyorganosiloxane contains a siloxane unit represented by $R^{21}R^{21}SiO_{2/2}$ (unit $D^{20}$).

Each of $R^{210}$ and $R^{220}$ is a group bonded to a silicon atom and represents an alkyl group. At least one of $R^{210}$ and $R^{220}$ is a methyl group. Specific examples of the alkyl group include those as exemplified above.

$R^{21}$ is a group bonded to a silicon atom and represents an alkyl group. Specific examples of the alkyl group include those as exemplified above. $R^{21}$ is preferably a methyl group.

In the present invention, examples of preferred methyl-group-containing polyorganosiloxanes include, but are not limited to, polydimethylsiloxane.

The methyl-group-containing polyorganosiloxane used as the additional polysiloxane (a3) contains the aforementioned siloxane unit (unit $D^{200}$ or unit $D^{20}$), but may also contain the aforementioned unit Q, unit M and/or unit T, in addition to unit $D^{200}$ or unit $D^{20}$.

In one embodiment of the present invention, specific examples of the methyl-group-containing polyorganosiloxane serving as the additional polysiloxane (a3) include polyorganosiloxane formed only of unit $D^{200}$, polyorganosiloxane formed of unit $D^{200}$ and unit Q, polyorganosiloxane formed of unit $D^{200}$ and unit M, polyorganosiloxane formed of unit $D^{200}$ and unit T, polyorganosiloxane formed of unit $D^{200}$, unit Q, and unit M, polyorganosiloxane formed of unit $D^{200}$, unit M, and unit T, and polyorganosiloxane formed of unit $D^{200}$, unit Q, unit M, and unit T.

In one preferred embodiment of the present invention, specific examples of the methyl-group-containing polyorganosiloxane serving as the polysiloxane (a3) include polyorganosiloxane formed only of unit $D^{20}$, polyorganosiloxane formed of unit $D^{20}$ and unit Q, polyorganosiloxane formed of unit $D^{20}$ and unit M, polyorganosiloxane formed of unit $D^{20}$ and unit T, polyorganosiloxane formed of unit $D^{20}$, unit Q, and unit M, polyorganosiloxane formed of unit $D^{20}$, unit M, and unit T, and polyorganosiloxane formed of unit $D^{20}$, unit Q, unit M, and unit T.

The viscosity of the methyl-group-containing polyorganosiloxane serving as the additional polysiloxane (a3) is generally 1,000 to 2,000,000 mm$^2$/s, preferably 10,000 to 1,000,000 mm$^2$/s. The methyl-group-containing polyorganosiloxane serving as the additional polysiloxane (a3) is typically dimethylsilicone oil formed of polydimethylsiloxane. The value of the viscosity is a kinematic viscosity (cSt (=mm$^2$/s)). The kinematic viscosity may be measured by means of a kinematic viscometer. Alternatively, the kinematic viscosity may also calculated by dividing viscosity (mPa·s) by density (g/cm$^3$). In other words, the kinematic viscosity may be determined from a viscosity as measured at 25° C. by means of an E-type rotational viscometer and a density. The calculation formula is kinematic viscosity (mm$^2$/s)=viscosity (mPa·s)/density (g/cm$^3$).

Specific examples of the methyl-group-containing polyorganosiloxane include, but are not limited to, WACKER (registered trademark) SILICONE FLUID AK series (product of WACKER) and dimethylsilicone oils (KF-96L, KF-96A, KF-96, KF-96H, KF-69, KF-965, and KF-968) and cyclic dimethylsilicone oil (KF-995) (products of Shin-Etsu Chemical Co., Ltd.).

Examples of the phenyl-group-containing polyorganosiloxane include a siloxane containing a siloxane unit represented by $R^{31}R^{32}SiO_{2/2}$ (unit $D^{30}$).

$R^{31}$ is a group bonded to a silicon atom and represents a phenyl group or an alkyl group, and $R^{32}$ is a group bonded to a silicon atom and represents a phenyl group. Specific examples of the alkyl group include those as exemplified above. $R^{31}$ is preferably a methyl group.

The phenyl-group-containing polyorganosiloxane used as the additional polysiloxane (a3) contains the aforementioned siloxane unit (unit $D^{30}$), but may also contain the aforementioned unit Q, unit M and/or unit T, in addition to unit $D^{30}$.

In one preferred embodiment of the present invention, specific examples of the phenyl-group-containing polyorganosiloxane serving as the additional polysiloxane (a3) include polyorganosiloxane formed only of unit $D^{30}$, polyorganosiloxane formed of unit $D^{30}$ and unit Q, polyorganosiloxane formed of unit $D^{30}$ and unit M, polyorganosiloxane formed of unit $D^{30}$ and unit T, polyorganosiloxane formed of unit $D^{30}$, unit Q, and unit M, polyorganosiloxane formed of unit $D^{30}$, unit M, and unit T, and polyorganosiloxane formed of unit $D^{30}$, unit Q, unit M, and unit T.

The weight average molecular weight of the phenyl-group-containing polyorganosiloxane serving as the additional polysiloxane (a3) is generally 1,500 to 500,000, but preferably 100,000 or lower, for the purpose of suppression of deposition in the adhesive and for other reasons.

Specific examples of the phenyl-group-containing polyorganosiloxane include, but are not limited to, PMM-1043 (product of Gelest Inc., weight average molecular weight: 67,000, viscosity: 30,000 mm$^2$/s) represented by formula (C-1), PMM-1025 (product of Gelest Inc., weight average molecular weight: 25,200, viscosity: 500 mm$^2$/s) represented by formula (C-2), KF50-3000CS (product of Shin-Etsu Chemical Co., Ltd., weight average molecular weight: 39,400, viscosity: 3,000 mm$^2$/s) represented by formula (C-3), TSF431 (product of MOMENTIVE, weight average molecular weight: 1,800, viscosity: 100 mm$^2$/s) represented by formula (C-4), TSF433 (product of MOMENTIVE, weight average molecular weight: 3,000, viscosity: 450 mm²/s) represented by formula (C-5), PDM-0421 (product of Gelest Inc., weight average molecular weight: 6,200, viscosity: 100 mm²/s) represented by formula (C-6), and PDM-0821 (product of Gelest Inc., weight average molecular weight: 8,600, viscosity: 125 mm²/s) represented by formula (C-7).

[F9]

(C-1)

(Each of m and n represents the number of repeating units.)

[F10]

(C-2)

(Each of m and n represents the number of repeating units.)

[F11]

(C-3)

(Each of m and n represents the number of repeating units.)

[F12]

(C-4)

(Each of m and n represents the number of repeating units.)

[F13]

(C-5)

(Each of m and n represents the number of repeating units.)

[F14]

(C-6)

(Each of m and n represents the number of repeating units.)

[F15]

(C-7)

(Each of m and n represents the number of repeating units.)

So long as the aforementioned effects of the present invention are not impaired, no particular limitation is imposed on the amount of the additional polysiloxane (a3) used. However, from the viewpoint of maintaining adhesion, the content of the adhesive (A) is generally 70 mass % or less, preferably 25 mass % or less.

For the purpose of adjusting the viscosity or for other reasons, the adhesive (A) employed in the present invention may contain a solvent. Specific examples of the solvent include, but are not limited to, an aliphatic hydrocarbon, an aromatic hydrocarbon, and a ketone.

More specific examples of the solvent include, but are not limited to, hexane, heptane, octane, nonane, decane, undecane, dodecane, isododecane, menthane, limonene, toluene, xylene, mesitylene, cumene, MIBK (methyl isobutyl ketone), butyl acetate, diisobutyl ketone, 2-octanone, 2-nonanone, and 5-nonanone. These solvents may be used singly or in combination of two or more species.

In the case where the adhesive (A) employed in the present invention contains a solvent, the solvent content is appropriately adjusted in consideration of a target viscosity of the adhesive, the application method to be employed, the thickness of the formed thin film, etc. The solvent content of the entire adhesive (A) is about 10 to about 90 mass %.

The adhesive (A) of the present invention may be produced by mixing film-forming components with a solvent. However, when no solvent is used, film-forming components may be mixed together, to thereby prepare the adhesive (A) employed in the present invention.

No particular limitation is imposed on the sequential order of mixing, so long as the adhesive (A) can be easily produced at high reproducibility. One possible example of the production method includes dissolving all film-forming components in a solvent. Another possible example of the production method includes dissolving a part of film-forming components in a solvent, dissolving the other film-forming components in another solvent, and mixing the thus-obtained two solutions. In this case, if required, a part of the solvent or a film-forming component having high dissolvability may be added in a final stage.

So long as the relevant components are not decomposed or denatured in preparation of the adhesive (A), the mixture may be appropriately heated.

In the present invention, in order to remove foreign substances present in the adhesive, the adhesive (A) may be filtered through a sub-micrometer filter or the like in the course of production of the adhesive or after mixing all the components.

The second adhesive layer of the laminate is produced by use of the adhesive (B), which is a polymer adhesive having an aromatic ring in at least one of a main chain and a side chain.

Specific examples of the polymer adhesive having an aromatic ring in at least one of a main chain and a side chain include, but are not limited to, a polycarbonate-based adhesive and a polystyrene-based adhesive.

Such polymer adhesives each having an aromatic ring in at least one of a main chain and a side chain may be used singly or in combination of two or more species.

The polymer adhesive having an aromatic ring in at least one of a main chain and a side chain may be a solvent-free adhesive formed only of adhesive components polymers, or an adhesive with solvent. Examples of the solvent include, but are not limited to, a aliphatic hydrocarbon, an aromatic hydrocarbon, and a ketone, and non-limitative specific examples of the solvent include those as exemplified above. These solvents may be used singly or in combination of two or more species.

The adhesive (B) of the present invention may be produced by mixing film-forming components with a solvent. However, when no solvent is used, film-forming components may be mixed together, to thereby prepare the adhesive (B) employed in the present invention.

No particular limitation is imposed on the sequential order of mixing, so long as the adhesive (B) can be easily produced at high reproducibility. One possible example of the production method includes dissolving all film-forming components in a solvent. Another possible example of the production method includes dissolving a part of film-forming components in a solvent, dissolving the other film-forming components in another solvent, and mixing the thus obtained two solutions. In this case, if required, a part of the solvent or a film-forming component having high dissolvability may be added in a final stage.

So long as the relevant components are not decomposed or denatured in preparation of the adhesive (B), the mixture may be appropriately heated.

The laminate production method of the present invention includes a first step of applying the adhesive (A) onto a surface of the first substrate, to thereby form a first adhesive coating layer; a second step of applying the adhesive (B) onto a surface of the second substrate, to thereby form a second adhesive coating layer; and a third step of applying a load to the first substrate and the second substrate in a thickness direction, to thereby closely adhere the first layer to the second layer, while the first adhesive coating layer of the first substrate and the second adhesive coating layer of the second substrate are subjected to at least one of a heat treatment and a reduced pressure treatment, and then performing a post-heat treatment, to thereby form the laminate.

In the case of an example of the present invention where the first substrate is a wafer, and the second substrate is a support, the adhesive (A) and the adhesive (B) are applied onto the first substrate and the second substrate, followed by heating. Alternatively, the two adhesives may be applied onto one of the substrates in the predetermined order, and then heated.

In the present invention, from the viewpoint of producing a laminate having excellent inner peelability at high reproducibility, a preferred mode includes applying the adhesive (A) onto a surface of the first substrate, to thereby form a first adhesive layer, and applying the adhesive (B) onto a surface of the second substrate, to thereby form a second adhesive layer.

More specifically, the adhesive (A) and the adhesive (B) are applied onto a circuit-furnished surface of a wafer serving as the first substrate and a surface of a support serving as the second substrate, respectively, followed by heating the layers, to thereby form first and second adhesive coating layers; and the circuit-furnished surface of the wafer is brought into contact with the surface of the support such that the two adhesive coating layers are in contact with each other. While a heat treatment and/or a reduced pressure treatment is performed, a load is applied to the first substrate and the second substrate in a thickness direction, to thereby closely adhere the first layer to the second layer. Subsequently, a post heat treatment is performed, to thereby form a laminate.

No particular limitation is imposed on the application method, and spin coating is generally employed. In an alternative method, a coating film is formed through spin coating or a similar technique, and the sheet-form coating film is attached. The concepts of the application method and the coating film of the invention also encompasses the alternative method and coating film.

The temperature of heating the coated adhesive (A) cannot definitely be determined, since the temperature varies depending on the type, thickness, etc. of the adhesive layer (B) used in combination with the adhesive (A). However, the heating temperature is generally 80° C. or higher, preferably 150° C. or lower, from the viewpoint of prevention of excessive curing. The time of heating is generally 30 seconds or longer, preferably 1 minute or longer, for securing temporary bonding performance. Also, the heating time is generally 5 minutes or shorter, preferably 2 minutes or shorter, from the viewpoint of suppressing deterioration of the adhesive layer and other members.

The temperature of heating the coated adhesive (B) cannot definitely be determined, since the temperature varies depending on the type, thickness, curability, etc. of the adhesive layer (B). However, the heating temperature is generally 120° C. or higher, and preferably 260° C. or lower, from the viewpoint of preventing excessive curing. The time of heating is generally 1 minute or longer, preferably 2 minutes or longer, for securing temporary bonding performance. Also, the heating time is generally 10 minutes or shorter, preferably 5 minutes or shorter, from the viewpoint of suppressing deterioration of the adhesive layer and other members.

Heating may be performed by means of a hot plate, an oven, or the like.

The thickness of the adhesive coating layer formed of the adhesive (A) is generally 5 to 500 µm. However, the thickness is preferably 10 µm or greater, more preferably 20 µm or greater, still more preferably 30 µm or greater, from the viewpoint of maintaining the film strength, and it is preferably 200 µm or less, more preferably 150 µm or less, still more preferably 120 µm or less, yet more preferably 70 µm or less, from the viewpoint of avoiding variation in uniformity of the film thickness.

The thickness of the adhesive coating layer formed of the adhesive (B) is generally 0.01 µm to 15 µm. However, the thickness is preferably 0.1 µm or greater, from the viewpoint of forming an adhesive layer having excellent peelability at high reproducibility, and it is preferably 5 µm or less, from the viewpoints of preventing debonding of a laminate in the production process and of producing such a laminate at high reproducibility.

According to the present invention, the laminate of the present invention can be produced by causing the adhesive coating layers to come into contact with each other and applying a load to the first substrate and the second substrate in a thickness direction, to thereby closely adhere the first layer to the second layer, while a heat treatment and/or a reduced pressure treatment is performed, and then performing post heating. Notably, the choice of the treatment (heat treatment and/or reduced pressure treatment) is determined in consideration of the composition of the adhesive (A), the type of the adhesive (B), the combination of the adhesives (A) and (B), the thickness, a target bonding strength, etc.

The heating treatment is generally performed at a temperature appropriately selected from a range of 20 to 150° C., in consideration of softening the adhesive coating layer to achieve suitable bonding of the layers, suitably curing the adhesive which is not sufficiently cured through heating employed for forming the adhesive coating layer, and other factors. Particularly, the heating temperature is preferably 130° C. or lower, more preferably 90° C. or lower, from the viewpoint of suppressing and avoiding excessive curing and undesired deterioration of the adhesive (A). The time of heating is generally 30 seconds or longer, preferably 1 minute or longer, for securing temporary bonding performance. Also, the heating time is generally 10 minutes or shorter, preferably 5 minutes or shorter, from the viewpoint of suppressing deterioration of the adhesive layer and other members.

In the reduced pressure treatment, the two adhesive coating layers which are in contact with each other are placed in an atmosphere at 10 Pa to 10,000 Pa. The time of the reduced pressure treatment is generally 1 to 30 minutes.

In one preferred embodiment of the present invention, the two adhesive coating layers which are in contact with each other are bonded together preferably through a reduced pressure treatment, more preferably through a heating treatment in combination with a reduced pressure treatment.

No particular limitation is imposed on the load which is applied to the first substrate and the second substrate in a thickness direction, so long as the first substrate, the second substrate, and the two layers therebetween are not damaged, and these elements are closely adhered. The load is generally 10 to 1,000 N.

The temperature of post-heating is preferably 120° C. or higher from the viewpoint of attaining sufficient curing rate, and preferably 260° C. or lower from the viewpoint of, for example, preventing deterioration of the substrates and the adhesives. The heating time is generally 1 minute or longer from the viewpoint of achieving suitable joining of a wafer through curing, preferably 5 minutes or longer from the viewpoint of stability in physical properties of the adhesives. Also, the heating time is generally 180 minutes or shorter, preferably 120 minutes or shorter, from the viewpoint of avoiding, for example, an adverse effect on the adhesive layers due to excessive heating. Heating may be performed by means of a hot plate, an oven, or the like.

Notably, a purpose of performing post-heating is to more suitably cure the adhesive (A).

Figure 1:
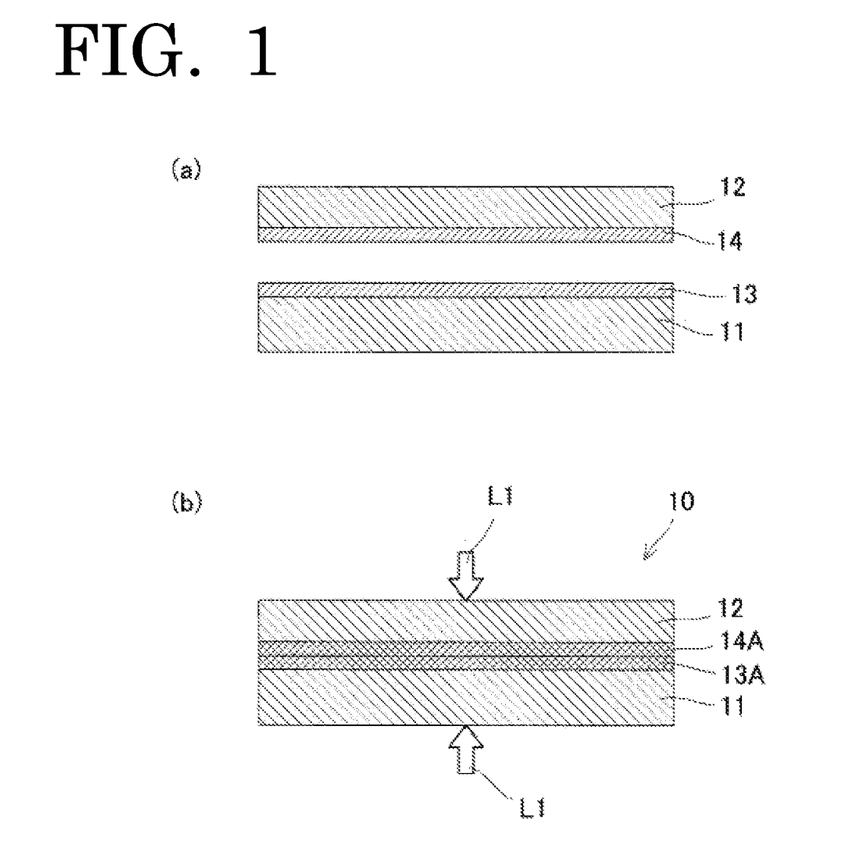
FIG. 1 A schematic view for illustrating the laminate production method of the present invention.

FIG. 1 schematically shows the laminate production method of the present invention. As shown in FIG. 1, a first substrate 11 and a second substrate 12 are provided. In one specific procedure, there are performed a first step of forming a first adhesive coating layer 13 on a surface of the first substrate 11, and a second step of applying an adhesive (B) onto a surface of the second substrate 12, to thereby form a second adhesive coating layer 14 (FIG. 1(a)). Subsequently, a third step is carried out. Specifically, the first substrate 11 is closely adhered to the second substrate 12 by the mediation of the first adhesive coating layer 13 and the second adhesive coating layer 14. A load L1 is applied to the interface between the first substrate and the second substrate, while, for example, a heating treatment and a reduced pressure treatment are performed. Through this step, the two layers are closely adhered to each other. Then, a post-heating treatment is performed, to thereby finally produce a laminate 10 having an adhesive layer 13A and an adhesive layer 14A (FIG. 1(b)).

In the laminate debonding method of the present invention, the laminate is irradiated with infrared laser light from the second substrate side, to thereby debond the second adhesive layer, whereby the second substrate and the second adhesive layer are removed. Generally, the debonding operation is carried out after completion of production of the laminate of the present invention and a specific processing and the like.

As used herein, the term "processing" refers to, for example, a processing of a surface opposite the circuit-furnished surface of a wafer; e.g., a thinning of a wafer by polishing the backside thereof. Thereafter, through silicon vias (TSVs) and the like are formed, and the thinned wafer is removed from the support. A plurality of such wafers are stacked to form a wafer laminate, to thereby complete 3-dimensional mounting. Before or after the above process, a backside electrode and the like are formed on the wafer. When thinning of a wafer and the TSV process are performed, a thermal load of 250 to 350° C. is applied to the laminate bonded to the support. The laminate of the present invention including the adhesive layers has heat resistance to the load.

The processing is not limited to the aforementioned process and includes, for example, a semiconductor part mounting process in the case where a wafer is temporarily bonded to a support for supporting a substrate on which semiconductor parts are to be mounted.

In one specific embodiment, when the backside surface (a surface opposite the circuit-furnished surface) of a wafer having a diameter of about 300 mm and a thickness of about 770 µm is polished, the thickness of the wafer can be reduced to about 80 µm to about 4 µm.

Figure 2:
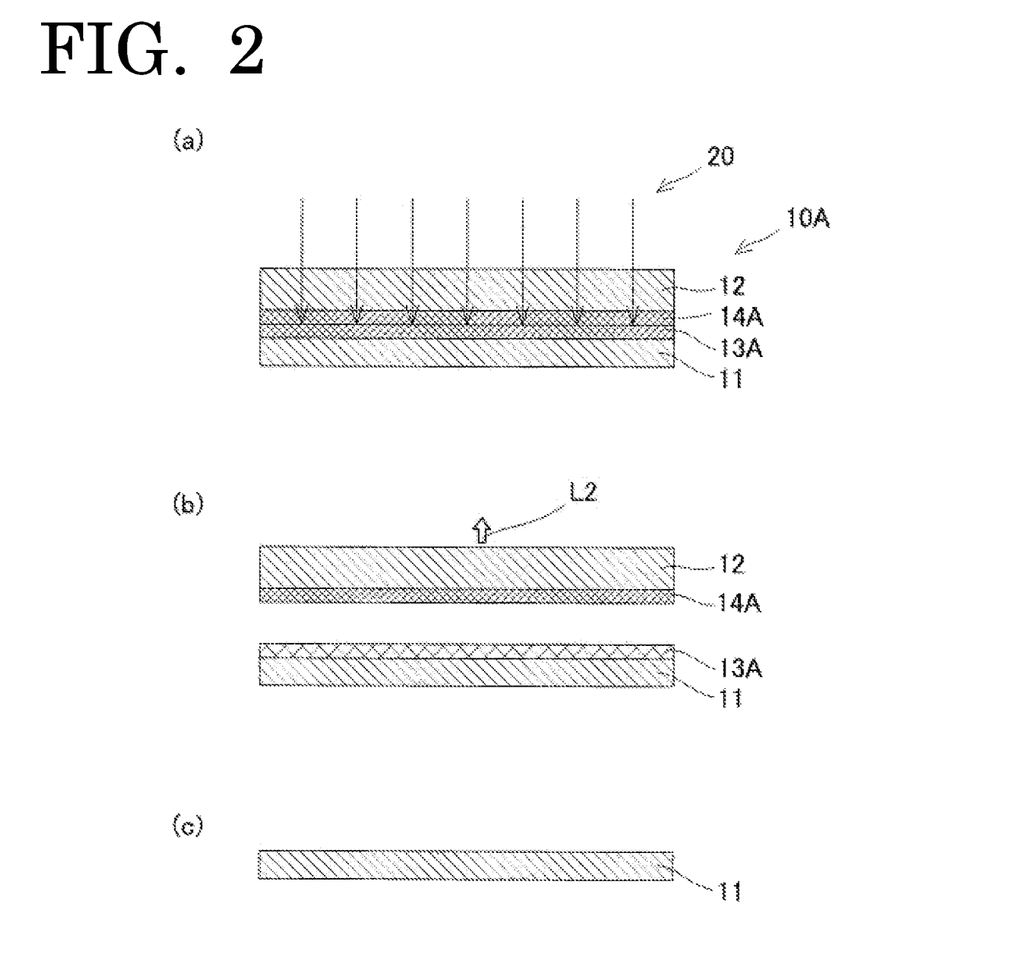
FIG. 2 A schematic view for illustrating an example of the debonding method of the present invention.

FIG. 2 is a schematic view for illustrating an example of the laminate debonding method of the present invention and a method for producing a processed first substrate from which an adhesive layer has been removed after debonding.

FIG. 2(a) shows a laminate 10A which has received certain processing. The laminate 10A is irradiated with infrared laser light 20 from a second substrate 12 side. The infrared laser light 20 passes through the second substrate 12 and the second adhesive layer 14A. When the first adhesive layer 13A is irradiated with infrared laser light 20, the first adhesive layer 13A is degraded through thermal decomposition or the like, whereby the adhesion considerably decreases. As a result, the adhesive layer becomes peelable.

Then, as shown in FIG. 2(b), when the second substrate 12 is detached from the first substrate 11, the second adhesive layer 14A is debonded with the second substrate 12 to which the adhesive layer 14A is attached. In this case, since the first adhesive layer 13A has been degraded to have a considerably reduced adhesiveness, the second substrate 12 is easily detached with the second adhesive layer 14A from the first substrate 11 and the first adhesive layer 13A by, for example, pulling up with small external force (L2).

Finally, the first adhesive layer 13A remaining on the first substrate 11 is removed by use of a cleaner formed of, for example, organic solvent, thereby yielding the first substrate 11 which has been processed (e.g., thinned) (FIG. 2(c)).

As described above, in the laminate of the present invention, the first adhesive layer which is provided on the first substrate and which is formed of the adhesive (A) containing a component that is cured through hydrosilylation is temporarily bonded, in a suitably peelable manner, to the second adhesive layer which is provided on the second substrate and which is formed of a polymer adhesive having an aromatic ring. Thus, when the laminate is irradiated with infrared laser light from a second substrate side, and the first adhesive layer receives the infrared laser light, the first adhesive layer is degraded through thermal decomposition or the like, whereby the adhesiveness of the layer decreases. As a result, the second substrate and the second adhesive layer can be easily detached from the first substrate and the first adhesive layer at the interface between the first adhesive layer and the second adhesive layer. In this case, adhesion at the interface between the first adhesive layer and the second adhesive layer decreases, and the adhesiveness of the second adhesive layer per se is lower than that of the first adhesive layer. Thus, debonding can easily occur at the interface.

Notably, the entire area of the first adhesive layer is not necessarily irradiated with infrared laser light. Even when the first adhesive layer has both an infrared laser light-irradiated area and an infrared laser light-non-irradiated area, it is sufficient that the bonding strength of the entire first adhesive layer is satisfactorily reduced. Under such conditions, the second adhesive layer and the second substrate can be easily separated, through application of small external force (e.g., pulling), from the laminate 10 at the interface between the second adhesive layer and the first adhesive layer. The ratio of the infrared laser light 20-irradiated area to the infrared laser light 20-non-irradiated area and the locational distribution of the two areas vary depending on the composition of the adhesive (A) forming the first adhesive layer, the type and composition of the adhesive (B) forming the second adhesive layer, the thickness of the first adhesive layer 13A, the intensity of irradiation infrared laser light, and other factors. However, those skilled in the art can set appropriate conditions, without carrying out excessive tests. For example, an infrared laser light-non-irradiated area may be provided adjacent to an infrared laser light-irradiated area with the same width as that of the infrared ray.

Thus, even when only a part of the adhesive layer is irradiated with infrared laser light, the second substrate 12 can be separated with the second adhesive layer 14A. As a result, the time for applying laser light to one laminate can be shortened, whereby the total time for debonding can be shortened.

EXAMPLES

The present invention will next be described in detail by way of example, which should not be construed as limiting the invention thereto. The apparatuses employed in the present invention are as follows.
(1) Agitator: AWATORI RENTAROU (product of Thinky Corporation)
(2) Bonding apparatus: XBS300 (product of Suess Microtec SE) or VJ-300 (product of Ayumi Industry Co., Ltd.)
(3) Dicing machine: Dicing machine SS30 (product of Toyko Seimitsu Co., Ltd.)
(4) Laser process apparatus (Debonding apparatus): Speedy 300 (product of Trotec Laser GmbH [laser wavelength: 10.6 μm, power: 75 W] (conditions: speed: 100 mm/s, 1,000 PPI/Hz)

[1] Preparation of Adhesive (A)

Preparation Example 1

A base polymer formed of an MQ resin having vinyl groups (Mw: 6,900) (product of WACKER Chemie AG) (10.00 g) serving as polysiloxane (a1), linear-chain polydimethylsiloxane having vinyl groups (viscosity: 1,000 mPa·s) (product of WACKER Chemie AG) (7.01 g) serving as polysiloxane (a1), linear-chain polydimethylsiloxane having SiH groups (viscosity: 70 mPa·s) (product of WACKER Chemie AG) (1.50 g) serving as polysiloxane (a2), linear-chain polydimethylsiloxane having SiH groups (viscosity: 40 mPa·s) (product of WACKER Chemie AG) (1.08 g) serving as polysiloxane (a2), and 1-ethynyl-1-cyclohexanol (product of WACKER Chemie AG) (0.049 g) serving as a polymerization inhibitor (A3) were agitated by means of an agitator, to thereby prepare a mixture.

To the thus-obtained mixture, there was added another mixture (0.118 g) prepared by agitating a platinum catalyst (product of WACKER Chemie AG) (1.0 g) serving as a platinum group metal catalyst (A2) and linear-chain polydimethylsiloxane having vinyl groups (viscosity: 1,000 mPa·s) (product of WACKER Chemie AG) (5.0 g) serving as polysiloxane (a1) by means of an agitator for 5 minutes. The resultant mixture was further agitated for 5 minutes, to thereby prepare an adhesive (A) of Preparation Example 1.

Comparative Preparation Example 1

Polystyrene (Mw: 28,000) (product of Aldrich) (30.0 g) was dissolved in mesitylene (70.0 g). The solution was filtered by means of a syringe (0.2 μm), to thereby yield a comparative adhesive (A) of Comparative Preparation Example 1.

[2] Preparation of Adhesive (B)

Preparation Example 2-1

Polycarbonate FPC-2136 (product of Mitsubishi Gas Chemical Company, Inc.) (7.5 g) was dissolved in cyclohexanone (80.74 g). The thus-obtained mixture was filtered by means of a syringe (0.2 μm), to thereby yield an adhesive (B) of Preparation Example 2-1.

Preparation Example 2-2

Polystyrene (Mw: 28,000) (product of Aldrich) (12.5 g) was dissolved in mesitylene (87.5 g). The solution was filtered by means of a syringe (0.2 μm), to thereby yield an adhesive (B) of Preparation Example 2-2.

[3] Production of Laminate and Debonding Test

Example 1

The adhesive (A) produced in Preparation Example 1 was applied onto a glass wafer (300 mm) through spin coating to a final film thickness of about 40 μm, and the wafer was heated at 150° C. for 1 minute, to thereby form a first adhesive coating layer on the glass wafer serving as a first substrate.

Separately, the adhesive (B) produced in Preparation Example 2-1 was applied onto a silicon wafer (300 mm) through spin coating to a final film thickness of about 1 μm, and the wafer was heated at 150° C. for 1 minute, to thereby form a second adhesive coating layer on the silicon wafer serving as a second substrate.

Then, the glass wafer and the silicon wafer were bonded together by means of a bonding apparatus such that the first adhesive coating layer and the second adhesive coating layer were sandwiched by the two wafers. The bonded product was post-heated at 200° C. for 10 minutes, to thereby produce a laminate. Bonding was performed at 23° C., and a reduced pressure of 1,000 Pa with a load of 30 N.

The thus-produced laminate was diced by means of a dicing apparatus to pieces (1 cm×1 cm), and the diced laminate pieces are used as samples for evaluation.

Example 2

The procedure of Example 1 was repeated, except that the adhesive (B) produced in Preparation Example 2-2 was used instead of the adhesive (B) produced in Preparation Example 2-1, to thereby produce a laminate and evaluation samples.

Comparative Example 1

The procedure of Example 1 was repeated, except that the comparative adhesive (A) produced in Comparative Preparation Example 1 was used instead of the adhesive (A) produced in Preparation Example 1, to thereby produce a laminate and evaluation samples.

Each of the laminates was irradiated with laser light by means of a laser processor to induce debonding. The laminate was irradiated with the laser light from the silicon wafer side, and irradiation was performed over the entire surface of the wafer under scanning. Table 1 shows the power (output) of the laser light and occurrence of debonding.

TABLE 1

|  | Adhesive (A) | Adhesive (B) | Output (%) | Debonding |
| --- | --- | --- | --- | --- |
| Ex. 1 | Prepn. Ex. 1 | Prepn. Ex. 2-1 | 40 | yes |
| Ex. 2 | Prepn. Ex. 1 | Prepn. Ex. 2-2 | 40 | yes |
| Comp. Ex. 1 | Comp. Prepn. Ex. 1 | Prepn. Ex. 2-1 | 100 | no |

After irradiation with laser light, debonding occurred in the laminate of the present invention, but debonding hardly occurred in the laminate of Comparative Example. After completion of debonding, the thickness of the first adhesive layer remaining on the first substrate and that of the second adhesive layer remaining on the second substrate were measured to be about 40 μm and about 1 μm, respectively.

INDUSTRIAL APPLICABILITY

According to the laminate debonding method of the present invention, debonding can be easily achieved by irradiation with infrared laser light generally employed in laser processing. Thus, debonding can be performed by means of an apparatus customary employed in laser processing, without use of a particularly arranged apparatus. This method can be applied to a variety of uses.

DESCRIPTION OF REFERENCE NUMERALS 10, 10A laminate
11 first substrate
12 second substrate
13 first adhesive coating layer
13A adhesive layer
14 second adhesive coating layer
14A adhesive layer
20 infrared laser light

The invention claimed is:

1. A laminate debonding method, the method comprising: producing a laminate by joining a first substrate formed of a semiconductor-forming substrate to a second substrate formed of a support substrate which allows passage of infrared laser light, by the mediation of a first adhesive layer provided on the first substrate and a second adhesive layer provided on the second substrate, wherein:
   the first adhesive layer is an adhesive layer obtained by curing an adhesive (A) containing a component which is cured through hydrosilylation, and
   the second adhesive layer is an adhesive layer which is obtained by use of an adhesive (B) formed of a polymer adhesive having an aromatic ring in at least one of a main chain and a side chain and which allows passage of infrared laser light; and
irradiating the laminate with infrared laser light from a second substrate side for debonding the second substrate at the interface between the first and second adhesive layers.

2. A laminate debonding method according to claim 1, wherein the adhesive (A) comprises
   a polysiloxane (A1), and
   a platinum group metal catalyst (A2); and
wherein the polysiloxane (A1) comprises:
   a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T', wherein each of $R^{1'}$ to $R^{6'}$ is a group bonded to a silicon atom and represents an alkyl group or an alkenyl group, and at least one of $R^{1'}$ to $R^{6'}$ is an alkenyl group, and
   a polyorganosiloxane (a2) having one or more units selected from the group consisting of a siloxane unit represented by $SiO_2$ (unit Q"), a siloxane unit represented by $R^{1"}R^{2"}R^{3"}SiO_{1/2}$ (unit M"), a siloxane unit represented by $R^{4"}R^{5"}SiO_{2/2}$ (unit D"), and a siloxane unit represented by $R^{6"}SiO_{3/2}$ (unit T"), and at least one unit selected from the group consisting of unit M", unit D", and unit T", wherein each of $R^{1"}$ to $R^{6"}$ is a group or an atom bonded to a silicon atom and represents an alkyl group or a hydrogen atom, and at least one of $R^{1"}$ to $R^{6"}$ is a hydrogen atom.

3. A laminate debonding method according to claim 2, wherein the infrared laser light has a wavelength of 1 to 20 micrometers.

4. A laminate debonding method according to claim 3, wherein the wavelength is 9.2 to 10.8 micrometers.

* * * * *